United States Patent
Neu et al.

(10) Patent No.: US 6,436,731 B2
(45) Date of Patent: Aug. 20, 2002

(54) METHOD OF PRODUCING A SEMICONDUCTOR DEVICE COMPRISING A CLEANING PROCESS FOR REMOVING SILICON-CONTAINING MATERIAL

(75) Inventors: Achim Neu, Regensburg; Volker Strutz, Tegernheim; Rüdiger Uhlmann, Dresden; Stephan Wege, Weissig, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/737,056

(22) Filed: Dec. 14, 2000

(30) Foreign Application Priority Data

Dec. 14, 1999 (DE) .......................... 199 60 249

(51) Int. Cl.⁷ .................. H01L 21/44; H01L 21/48; H01L 21/50; H01L 21/302; H01L 21/461
(52) U.S. Cl. .................. 438/115; 438/710; 438/720
(58) Field of Search ................ 438/115, 710, 438/720

(56) References Cited

U.S. PATENT DOCUMENTS 5,776,551 A * 7/1998 Pasch .................. 427/534
5,966,592 A * 10/1999 Beroz et al. .............. 438/111

FOREIGN PATENT DOCUMENTS

JP  63289941 AA  11/1988

OTHER PUBLICATIONS

J.A. Barkanic et al.: "Plasma Etching Using NF₃: A Review", Solid State Technology/ Apr. 1989, pp. 109–115.

Hilmar Beine: "Mikro–BGA: Durchbruch für die Chip–Scale–Packages"["Micro–BGA: Breakthrough for the Chip–Scale Packages"], productronic 11/97.

Jean–Pierre Moscicki: "CSP–BGA–Gehäuse: Die Kleinsten der Kleinen" ["CSP–BGA–Packages: The Smallest of the Small"], Elektronik Dec. 1998.

* cited by examiner

Primary Examiner—Tuan H. Nguyen
Assistant Examiner—Nema Berezny
(74) Attorney, Agent, or Firm—Laurence A. Greenberg; Werner H. Stemer; Ralph E. Locher

(57) ABSTRACT

A method of producing a semiconductor device is described. The semiconductor device has a semiconductor chip with wiring terminals, conductor tracks for the electrical connection of the semiconductor chip, and a component of a housing configuration that contains organic, silicon-containing material. For this purpose, the semiconductor chip is applied to the component of the housing configuration and permanently connected to it. The conductor tracks and/or the wiring terminals are subsequently subjected to a cleaning process, in which silicon-containing material adhering to a surface is eliminated. The conductor tracks are subsequently connected in an electrically conducting manner to the wiring terminals. The contact quality of these electrical connections is noticeably improved by the cleaning process provided.

10 Claims, 1 Drawing Sheet

METHOD OF PRODUCING A SEMICONDUCTOR DEVICE COMPRISING A CLEANING PROCESS FOR REMOVING SILICON-CONTAINING MATERIAL

BACKGROUND OF THE INVENTION

1. Field of the Invention

The present invention relates to a method of producing a semiconductor device in which a semiconductor chip with wiring terminals is applied to a component of a housing configuration which contains organic, silicon-containing material, and in which the conductor tracks are subsequently connected to the wiring terminals.

Integrated semiconductor devices are used in various applications. A semiconductor chip with wiring terminals (so-called bond pads) is in this case generally packaged in a housing and mounted on a printed-circuit board. For example, a semiconductor device is disposed in a housing configuration in accordance with a so-called fine-pitch ball grid array (FBGA) housing configuration, which is based in particular on the so-called beam-lead-bonding technique. This type. of housing configuration can be advantageously used in particular in the case of semiconductor memory devices based on Rambus technology with comparatively high clock-pulse rates, since in particular line inductances are relatively low because of the specific configuration of the arrangement.

The FBGA housing configuration, also referred to as an FBGA package, usually contains a semiconductor chip with terminals for the electrical connection to the terminals of the printed-circuit board and a flexible printed-circuit board (also referred to as interposer) with a substrate and conductor tracks applied to it. Applied in turn to the interposer there are usually a plurality of spacers (also referred to as nubbins).

During the mounting of the semiconductor chip, it is initially attached to the spacers with or without an additional layer of adhesive (so-called die bonding), whereby a narrow intermediate space is produced between the semiconductor chip and the interposer. To conform to the customary configuration requirements, the spacers and adhesive are formed of organic silicon-containing materials. In a subsequent production step (so-called lead bonding), parts of the conductor tracks (so-called leads) are bent from the interposer onto the wiring terminals of the semiconductor chip and are welded on there with the aid of heat, pressure and ultra sound. The requirements for the quality of the welded contacts are relatively high, in order that the functionality of the semiconductor device is ensured even under high electrical demands, for example at high clock-pulse rates.

For attaching the semiconductor chip on the spacers, the semiconductor device is usually subjected to a process at a correspondingly elevated process temperature, in which the silicon-containing material of the layer of adhesive and the spacers is released. This then generally adheres to the surfaces of the conductor tracks and/or wiring terminals of the semiconductor chip as a contaminant layer. This impairs the contact quality during the later connection of the conductor tracks to the wiring terminals of the semiconductor chip.

SUMMARY OF THE INVENTION

It is accordingly an object of the invention to provide a method of producing a semiconductor device that overcomes the above-mentioned disadvantages of the prior art methods, in which a semiconductor chip is applied to a silicon-containing component of a housing configuration, and which ensures relatively high contact quality during the later connection of the semiconductor tracks to the wiring terminals of the semiconductor chip.

With the foregoing and other objects in view there is provided, in accordance with the invention, a method of producing a semiconductor device. The method includes providing a housing configuration formed of conductor tracks and a component formed of an organic, silicon-containing material connected to the conductor tracks. A semiconductor chip having wiring terminals is permanently connected to the component of the housing configuration. The conductor tracks and/or the wiring terminals are then subjected to a cleaning process, for removing any of silicon-containing material adhering to a surface of either the conductor tracks or the wiring terminal. The conductor tracks are then connected, in an electrically conducting manner, to the wiring terminals.

According to the invention, the semiconductor chip is applied to the component of the housing configuration that contains the organic silicon-containing material and is permanently connected to the component of the housing configuration. The conductor tracks for the electrical connection of the semiconductor chip and/or the wiring terminals of the semiconductor chip are subsequently subjected to a cleaning process, in which silicon-containing material adhering to a surface is eliminated. Following this, the conductor tracks are connected in an electrically conducting manner to the wiring terminals of the semiconductor chip. The cleaning process ensures that any contaminant layer of silicon-containing material is removed. Such a contaminant layer may be located on the conductor tracks and/or the wiring terminals of the semiconductor chip.

This eliminates contaminants that are present before the semiconductor chip is applied and contaminants that are caused by the semiconductor chip being applied. The described sequence of the method steps ensures that, during the connection of the conductor tracks, good contact quality is made possible by clean surfaces.

If other provisions are made in the production of the semiconductor device, for example there is already a method step for cleaning devices of, for example, carbon compounds, it can be modified in a way according to the invention. With the cleaning process described, the substrate and the conductor tracks located on it (the interposer) and also the spacers located on that can be additionally cleaned before the semiconductor chips are applied.

An advantageous development of the invention provides that the conductor tracks are additionally subjected to the cleaning process described before the semiconductor chip is applied to the component of the housing configuration. This cleaning step is provided for any contaminants of silicon-containing material that are already present before the semiconductor chip is applied to be removed before it is applied. This can additionally improve the contact quality during the later connection of the conductor tracks.

In an advantageous embodiment of the invention, the cleaning process has a plasma etching process. The etching removal required to eliminate a contaminant layer takes place by dry etching by use of atoms or molecules of a gas and/or by bombardment of the surface to be etched with ions, photons or electrons. The etching process may, for example, be of a physical or chemical type.

For etching away entire surfaces of layers, a chemical plasma etching process may be used for example. In this, a chemical etching reaction takes place between excited particles of a reaction gas and atoms of the surface to be etched. Consequently, silicon-containing material adhering to a surface is chemically converted and detached from the surface by the reaction gas. A precondition for such a cleaning operation is in this case the formation of a gaseous volatile reaction product that can be carried away in the gaseous state.

It is favorable in this case that the reaction gas has a fluorine component. For example, excited fluorine atoms from the plasma form with the atoms of the surface contaminated with silicon-containing material the volatile reaction product $SiF_4$.

$CF_4$, $SF_6$ or $NF_3$ may be used for example as the reaction gas. In the case of the cleaning process with the plasma etching process described, undesired byproducts may occur and be deposited on the surfaces to be cleaned. For example, when $CF_4$ is used, an increased tendency for carbon compounds to be deposited (for example polymer deposits) can be observed. However, reaction products that are produced by the cleaning process being applied are also formed when $SF_6$ or $NF_3$ is used. These reaction products may be caused, for example, by the cleaning by the reaction gas also affecting surrounding material that is not to be cleaned of contaminants.

It is therefore favorable that, after the cleaning process, a further cleaning process is carried out, removing a reaction product that is adhering to a surface and is produced by the cleaning process being applied for eliminating silicon-containing material. This further cleaning process contributes to making sure that undesired byproducts of the preceding plasma cleaning do not contribute to impairing the contact quality. In a way similar to the preceding cleaning process for the removal of silicon-containing material, this further cleaning process may be carried out repeatedly, in order to improve the cleaning result further.

Since the mode of operation of the further cleaning process is similar to the mode of operation of the preceding cleaning process for the removal of silicon-containing material, the further cleaning process advantageously has a plasma etching process.

In accordance with an added feature of the invention, there is the step of forming the housing configuration as a fine-pitch ball grid array (FBGA) housing configuration.

In accordance with a concomitant feature of the invention, there is the step of providing the component of the FBGA housing configuration with a spacer.

Other features which are considered as characteristic for the invention are set forth in the appended claims.

Although the invention is illustrated and described herein as embodied in a method of producing a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
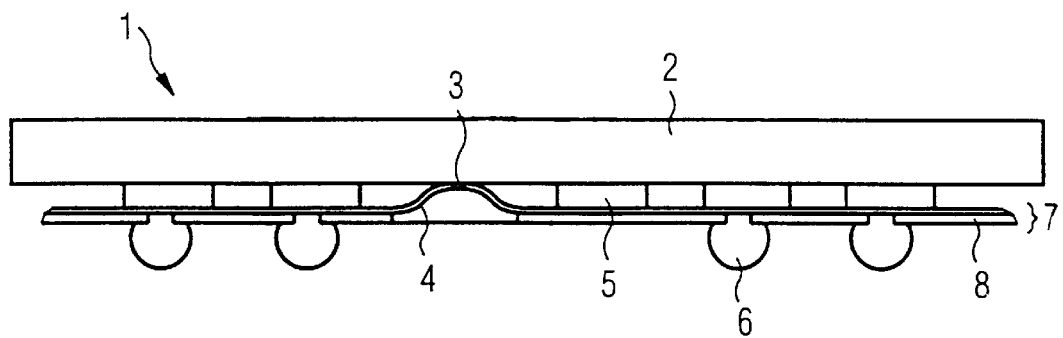
FIG. 1 is a diagrammatic, cross-sectional view of a semiconductor device in an FBGA housing configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a cross section of a semiconductor device 1 in a so-called fine-pitch ball grid array (FBGA) housing configuration. For producing the housing configuration, a. flexible printed-circuit board 7 (an interposer), formed of a substrate 8 and conductor tracks 4 and to which a plurality of spacers 5 are applied, is used. In the so-called die bonding, a semiconductor chip 2 is attached by wiring terminals 3 on the spacers 5 with or without an additional layer of adhesive. This produces a narrow intermediate space between the semiconductor chip 2 and the interposer 7. To conform to the configuration requirements, the spacers 5 and the layer of adhesive possibly used are formed of organic silicon-rubber-containing materials (for example polymers). Additionally, the interposer 7 is connected by soldering beads 6 for example to a printed-circuit board.

In the production step of the so-called lead bonding, parts of the conductor tracks 4 (leads) are bent from the interposer 7 onto the wiring terminals, also called bond pads 3, of the semiconductor chip 2 and are welded on there with the aid of heat, pressure and ultrasound. In the interests of good contact quality, the mutually touching surfaces of the conductor tracks 4 and the bond pads 3 should in particular be free of silicon-containing contaminants. These may be produced in the method of producing the semiconductor device 1 when the semiconductor chip 2 is applied to the spacers 5 and is permanently bonded to them. Before the conductor tracks 4 are connected in. an electrically conducting manner to the bond pads 3 of the semiconductor chip 2, the conductor tracks 4 and/or the bond pads 3 are subjected to a cleaning process, in which any silicon-containing contaminants are eliminated.

Figure 2:
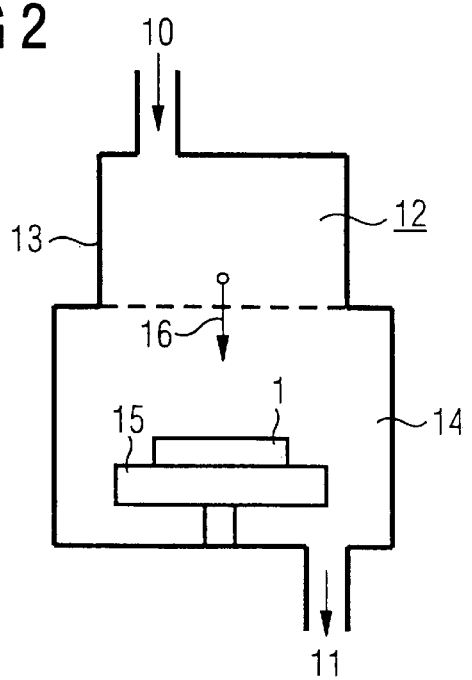
FIG. 2 is a schematic representation of a configuration of An apparatus for a plasma etching process.

Represented in FIG. 2 is a schematic configuration of a device for a plasma etching process. For etching, a suitable reaction gas 10 is fed to the previously almost evacuated reaction chamber 14. Oxygen with a 5–20% addition of the reaction gas $CF_4$ serves for example as the reaction gas 10. A plasma 12 is produced from the reaction gas 10 in a chamber 13. Excited atoms or molecules diffuse out of the plasma 12 to the semiconductor device 1 (particle jet 16), which is applied to a substrate 15, and react chemically with the atoms of the contaminated surfaces. A precondition for the etching is the formation of volatile reaction products, which can be sucked away by a pump 11.

In a further cleaning process, reaction products that are adhering to the surfaces and are produced for example by the reaction gas $CF_4$ being applied are removed. The plasma cleaning process applied once again for this purpose uses, for example, a reaction gas 10 containing pure oxygen. This reacts with the carbon compounds adhering to the surfaces to form carbon dioxide or carbon monoxide ($CO_2$, CO), which is pumped away by the pump 11.

We claim:

1. A method of producing a semiconductor device, which comprises the steps of:

providing a housing configuration formed of conductor tracks and a component formed of an organic, silicon-containing material connected to the conductor tracks;

permanently connecting a semiconductor chip having wiring terminals to the component of the housing configuration;

subjecting at least one of the conductor tracks and the wiring terminals to a cleaning process after connecting the semiconductor chip to the component of the housing configuration, for removing any of the silicon-containing material adhering to a surface of at least one of the conductor tracks and the wiring terminals; and connecting the conductor tracks in an electrically conducting manner to the wiring terminals.

2. The method according to claim 1, which comprises performing a plasma etching process during the cleaning process.

3. The method according to claim 2, which comprises using a reaction gas which chemically converts the silicon-containing material al adhering to the surface of at least one of the conductor tracks and the wiring terminals and detaches it from the surface during the plasma etching process.

4. The method according to claim 3, which comprises providing the reaction gas with a fluorine component.

5. The method according to claim 4, which comprises using a gas selected from the group consisting of $CF_4$, $SF_6$ and $NF_3$ as the reaction gas.

6. The method according to claim 1, which comprises after the cleaning process, carrying out a further cleaning process for removing a reaction product which is adhering to the surface and is produced by the cleaning process being applied.

7. The method according to claim 6, which comprises performing a plasma etching process during the further cleaning process.

8. The method according to claim 1, which comprises subjecting the conductor tracks to an additional cleaning process before the semiconductor chip is connected to the component of the housing configuration.

9. The method according to claim 1, which comprises forming the housing configuration as a fine-pitch ball grid array (FBGA) housing configuration.

10. The method according to claim 9, which comprises providing the component of the FBGA housing configuration with a spacer.

* * * * *